United States Patent
Sohda et al.

(10) Patent No.: US 6,838,682 B2
(45) Date of Patent: Jan. 4, 2005

(54) ELECTRON BEAM EXPOSURE EQUIPMENT AND ELECTRON BEAM EXPOSURE METHOD

(75) Inventors: Yasunari Sohda, Kawasaki (JP); Osamu Kamimura, Kokubunji (JP); Hiroya Ohta, Kodaira (JP); Susumu Gotoh, Tokyo (JP)

(73) Assignees: Hitachi High-Technologies Corporation, Tokyo (JP); Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/634,878

(22) Filed: Aug. 6, 2003

(65) Prior Publication Data

US 2004/0119026 A1 Jun. 24, 2004

(30) Foreign Application Priority Data

Dec. 20, 2002 (JP) ........................... 2002-369810

(51) Int. Cl.[7] ............................... H01J 37/304
(52) U.S. Cl. .................. 250/491.1; 250/492.22; 250/492.23; 250/396 R; 250/396 ML; 250/397
(58) Field of Search ................ 250/491.1, 396 ML, 250/396 R, 397, 492.1, 492.23, 492.22

(56) References Cited

U.S. PATENT DOCUMENTS 4,798,953 A * 1/1989 de Chambost ............... 250/310
6,452,193 B1 * 9/2002 Goto ........................ 250/491.1
6,593,152 B2 * 7/2003 Nakasuji et al. ............... 438/14

FOREIGN PATENT DOCUMENTS

| JP | 10-106931 | 4/1998 |
| JP | 10-302696 | 11/1998 |
| JP | 10-303095 | 11/1998 |

OTHER PUBLICATIONS

Micro Electronic Engineering, vol. 21, 1993, pp. 145–148.

* cited by examiner

Primary Examiner—Nikita Wells
(74) Attorney, Agent, or Firm—Mattingly, Stanger & Malur, P.C.

(57) ABSTRACT

There is provided an electron beam exposure technique which permits optical adjustment in an electron optics system using a doublet lens necessary for large field projection.

Electron beam exposure equipment having a part forming one image by at least two electromagnetic lenses, has means measuring the position of an electron beam near an image plane with changing excitation of at least two lenses at the same time; and control means feeding back the measured result to aligners or the intensity of the lenses.

20 Claims, 6 Drawing Sheets

ELECTRON BEAM EXPOSURE EQUIPMENT AND ELECTRON BEAM EXPOSURE METHOD

BACKGROUND OF THE INVENTION

The present invention relates to an electron beam exposure technique. More specifically, the present invention relates to high-precision electron beam exposure equipment and exposure method.

In electron beam writing equipment, optical adjustment of an electron beam is one of the most important techniques.

In a prior art, axis adjustment of an electron beam lens is performed by measuring the change of position of an electron beam with changing the focus length of the lens (for example, see Micro Electronic Engineering, vol. 21, 1993, pp. 145–148). The method, however, is used only in a point beam and a micro area beam substantially handled as a point beam in which a crossover is larger than an image. In addition, a focal point is changed by varying excitation of one lens.

There are electron beam exposure equipment having a method for projecting a large field electron beam onto a sample and a method for exposing a large field by plural electron beams at the same time. In these methods, there is no guide for the above axis adjustment. In a method for using plural electron beams which can control on/off independently in the large field projection methods, correction using only a specific electron beam is proposed (for example, see Japanese Patent Application Laid-Open No. 10-106931). In such proposition, a method about optical adjustment of a lens is not described.

Further, in a prior art, a method for adjusting an optics system of large field projection is proposed. To permit wide deflection, plural detectors and lens interference are finely adjusted to ultimately change the lens characteristic, thereby realizing low aberration. It is very complex (for example, see Japanese Patent Application Laid-Open No. 10-303095).

As a simplified method, a method for adjusting the position of a crossover (pupil image) is proposed. This method is limited (for example, see Japanese Patent Application Laid-Open No. 10-302696).

In large field projection aiming at higher throughput, an electron optics system using a doublet lens is required. The doublet lens substantially equalizes the sum of the focus lengths of two electromagnetic lenses and the distance between the two electromagnetic lenses to form one image plane by the two electromagnetic lenses. In the above prior art, a simplified optical adjustment method for using the lenses of this method with high precision is not considered.

SUMMARY OF THE INVENTION

An object of the present invention is to provide an electron beam exposure technique which permits optical adjustment in an electron optics system using a doublet lens necessary for large field projection.

To achieve the above object, the present invention has an electron beam optics system having a construction to form one image by at least two electromagnetic lenses, wherein the position of an electron beam near an image plane with changing excitation of at least two lenses is measured, and aligners and/or the intensity of the two lenses which can reflect the measured result is reset.

When multi beams are used to measure the position of a specific beam thereof, an optical axis characteristic can be measured independently in various positions of large field projection. As a result, the amount of information is increased due to feedback to adjustment. Feedback to plural electron optical devices resetting the driving current of the aligner and the driving current of the lens is facilitated.

One specific beam need not be limited. In the case that one specific beam is limited, when the amount of current of one specific beam is small, the position measurement precision may be insufficient. Plural electron beams in a specific area are used to resolve the lack of the amount of current. The position may be represented by an average of plural beams. Each of the positions of all multi beams need not be found in optical adjustment. This method is effective.

One of the changes of excitation of the two lenses is stronger excitation and the other is weaker excitation. The directions of the changes of excitation are opposite from each other. To perform it more effectively, the magnitudes of the rates of change of excitation current of the two lenses may be almost equal. This is effective for adjustment so that an electron beam is incident perpendicularly upon an image plane.

Perpendicular incidence is important to obtain a good optical characteristic in a doublet lens. When the coil turns of the two electromagnetic lenses are almost equal, the magnitudes of the change of excitation currents of the two lenses may be almost equal. Adjustment can be easy.

In resetting, the ratio between the magnitude of the rate of change of excitation current of the upstream lens and the magnitude of the rate of change of excitation current of the downstream lens is almost equal to a magnification decided by the two lenses. This method is also effective. This method can adjust the ratio of motion between the lenses while substantially fixing the position of an image plane, facilitating feedback.

Representative construction examples of the present invention will be listed below.

(1) Electron beam exposure equipment according to the present invention has: an electron gun; an electron optics system irradiating an electron beam emitted from the electron gun on a sample via aligners and two electromagnetic lenses for forming one image; and an electron detector used for detecting the position of the electron beam, wherein the position of an electron beam near an image plane with changing excitation of the two electromagnetic lenses is measured, and driving of the aligners and/or the excitation intensity of the two electromagnetic lenses is reset based on the measured result for performing optical adjustment of the electron optics system.

(2) Electron beam exposure equipment according to the present invention has: an electron optics system irradiating plural electron beams arrayed at a predetermined pitch on a sample via aligners and a doublet lens having two electromagnetic lenses for forming one image; and an electron detector used for detecting the position of the electron beam, wherein in a specific electron beam of the plural electron beams, the position of the electron beam near an image plane with changing excitation of the two electromagnetic lenses is measured, and driving of the aligners and/or the excitation intensity of the two electromagnetic lenses is reset based on the measured result for performing optical adjustment of the electron optics system.

(3) Electron beam exposure equipment according to the present invention has: an electron gun; an electron optics system irradiating an electron beam emitted from the electron gun on a sample via aligners and at least two electromagnetic lenses for forming one image; and an electron detector used for detecting the position of the electron beam, wherein the position of an electron beam near an image plane with changing excitation of the at least two electromagnetic lenses is measured, and driving of the aligners and/or the excitation intensity of the two electromagnetic lenses is reset based on the measured result for performing optical adjustment of the electron optics system.

(4) An electron beam exposure method according to the present invention has the steps of: irradiating an electron beam emitted from an electron gun on a sample via aligners and an electron optics system having two electromagnetic lenses for forming one image; detecting the position of the electron beam using an electron detector; and measuring the position of an electron beam near an image plane with changing excitation of the two electromagnetic lenses to reset driving of the aligners and/or the excitation intensity of the two electromagnetic lenses based on the measured result for performing optical adjustment of the electron optics system.

DETAILED DESCRIPTION OF THE PREFERRED EMBODIMENTS

Embodiments of the present invention will be described below in detail with reference to the drawings.

(Embodiment 1)

Figure 1:
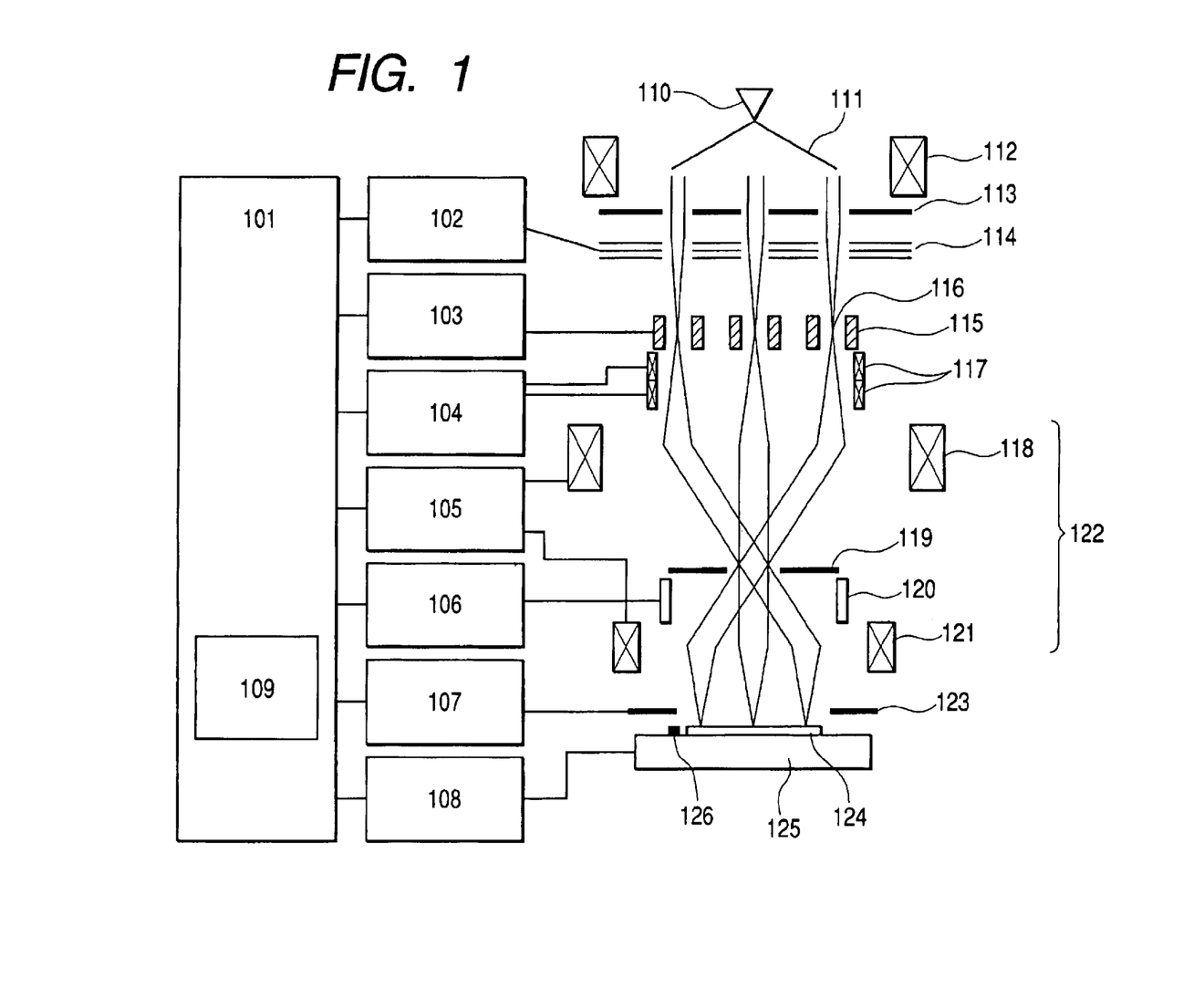
FIG. 1 is a diagram showing a system configuration example of Embodiment 1 of the present invention.

FIG. 1 shows an equipment configuration example of this embodiment. An electron beam 111 emitted from an electron gun 110 is a parallel beam through a condenser lens 112, and is then divided into plural point beams by an aperture array 113 having plural apertures. A lens array 114 at the later stage forms intermediate images 116 of the point beams. A blanker array 115 and a blanking aperture 119 are provided so as to individually switch on/off the plural point beams.

The multi point beams thus formed are condensed by a doublet lens 122 having a first projection lens 118 and a second projection lens 121 to be image formed onto a sample 124. The multi beams are distant from each other so as to provide large field projection in which the maximum distance of an electron beam on a pupil image is substantially longer than the maximum distance of the electron beam on an object plane.

Between the two projection lenses 118, 121 of the doublet lens, there is a deflector 120 to define the writing position on the sample 124. On a stage 125 is provided a mark 126 for detecting the position of an electron beam. A laser interferometer, not shown, measuring the position of the stage 125 and a backscattered electron detector 123 are used to measure the position of an electron beam. In this example, the electron detector detecting a backscattered electron from the mark 126 is used for measuring the position of an electron beam. An electron detector detecting an electron transmitted through the mark may be also used.

Above the first projection lens 118 as the first lens of the doublet lens 122 are provided aligners 117 in two stages. They are engaged with each other to adjust the incident angle and the incident position of an electron beam upon the lens.

The aligners 117 are driven by an aligner control circuit 104. The doublet lens 122 is driven by a lens control circuit 105. In this embodiment, specifically, electric currents are supplied. The set value of each of the electric currents is decided by information given by a data control circuit 101. A focus control circuit 102 and a pattern generating circuit 103 supply a voltage to operate the corresponding optical device. The set values of these are also decided by information given by the data control circuit 101. The data control circuit 101 uses information obtained from a signal handling circuit 107 and a stage control circuit 108 to perform calculation deciding the amount of operation of the lenses and the aligners. This equipment has a display having a screen making use of these functions to set the change of excitation, display the amount of change of the position of an electron beam, or reset the aligners and lens excitation currents. The aligner and lens operation conditions are optimized to perform optical adjustment.

Figure 2:
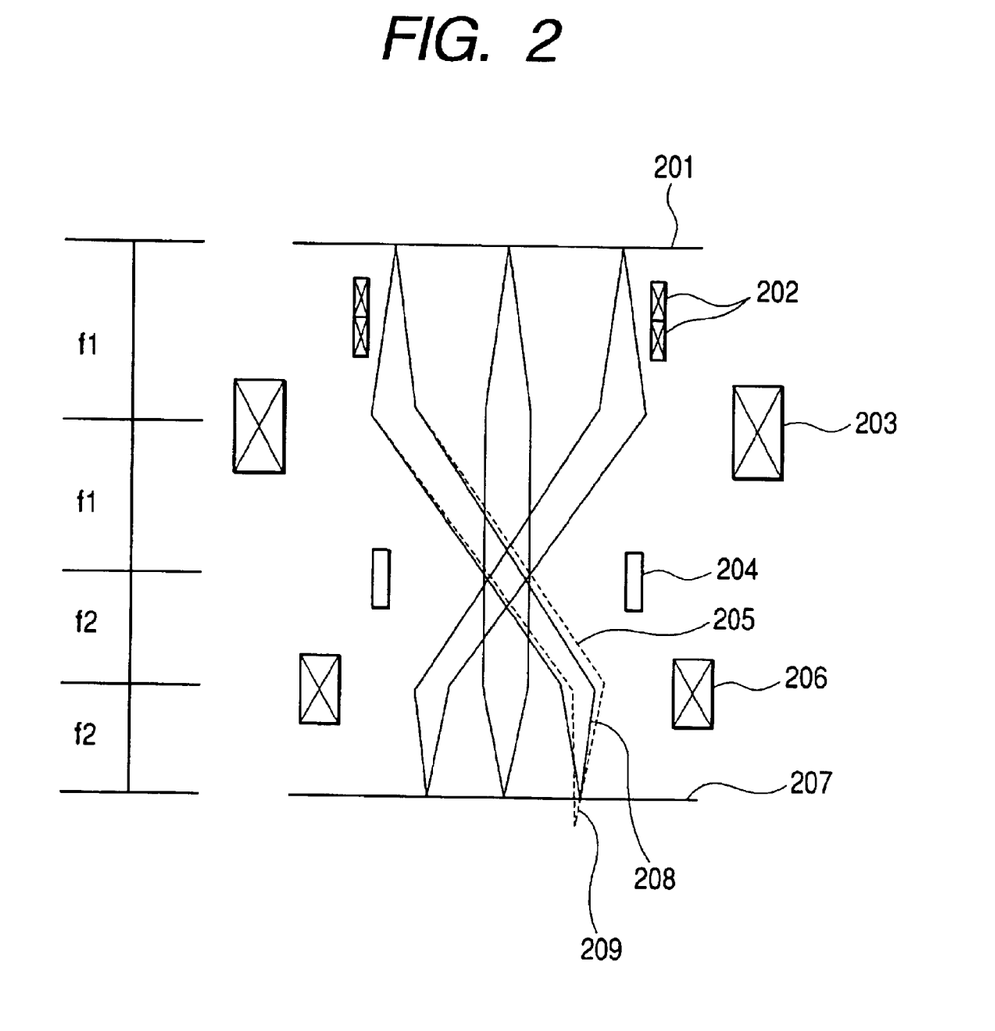
FIG. 2 is a diagram showing a ray trace of Embodiment 1.

FIG. 2 shows the ray trace of the doublet lens. The distance from an object plane 201 to the center of a first projection lens 203 as the first lens is almost equal to a focus length (f1) of the first projection lens 203. The distance between the center of the first projection lens 203 and the center of a second projection lens 206 as the second lens is almost equal to the sum of the focus length (f1) of the first projection lens 203 and a focus length (f2) of the second projection lens 206. The distance from the center of the second projection lens 206 to an image plane 207 is almost equal to the focus length (f2) of the second projection lens 206. It is hard to recognize the focus lengths independently with high precision, which makes adjustment of the lenses difficult.

The position of a pupil image 205 is located downstream by the distance from the center of the first projection lens 203 to substantially the focus length (f1) of the first projection lens 203. It is difficult to measure the position with high precision. Only the position of the pupil image 205 is insufficient for adjustment of large field projection.

To permit high-precision projection in the doublet lens, ideally, perpendicular incidence to the double lens coincides with perpendicular outward therefrom and the center of all electron beams coincides with the axial center of the lens. When satisfying a perpendicular condition, there is no change of position at the same height to the change of the lens condition according to the following equation.

$$(\Delta f1/f1 + \Delta f2/f2) - ((f1-f2) \times f2) \times \Delta f1 \times \Delta f2/(f1 \times f2) = 0$$

where f1 and f2 are the respective focus lengths of the first projection lens and the second projection lens, and $\Delta f1$ and $\Delta f2$ are the respective amounts of change of focal point thereof. In this embodiment, f1=250 mm and f2=25 mm. The magnification is 0.1.

The right side of the above equation includes multiplication of the rates of change of focus length. As described later, the rates of change are generally below 1%, which are incomparably smaller than that of the left side.

The above equation is substantially deformed to the following equation.

$$\Delta f1/f1 + \Delta f2/f2 = 0$$

When this is converted to the driving currents of the electromagnetic lenses, the following equation is given.

$$\Delta I1/I1 + \Delta I2/I2 = 0$$

where I1 and I2 are the respective excitation currents of the first projection lens and the second lens, and ΔI1 and ΔI2 are the respective amounts of change of current thereof.

As is apparent from the signs of these equations, in excitation, one of the two lenses of the doublet lens is under stronger excitation and the other is under weaker excitation. The magnitudes of the rates of change of focus length of the two lenses or the magnitudes of the rates of change of excitation current thereof are equal.

While changing the set values of aligner driving and lens driving, optimization is performed so as to reduce the change of position due to the change of excitation substantially according to the above conditions, thereby permitting optical adjustment.

The reset values of the aligners and lenses may be freely changed. To perform it efficiently, effectively, one of the two lenses is under stronger excitation and the other is under weaker excitation, and then, the values of the lenses are reset with the least possible change of the focal point position. More specifically, it is desirable to substantially satisfy the following conditions.

$$\Delta f1/(f1 \times f1) + \Delta f2/(f2 \times f2) = 0$$

or $$\Delta I1/(I1 \times f1) + \Delta I2/(I2 \times f2) = 0$$

At feedback, the ratio between the magnitude of the rate of change of excitation current of the first projection lens on the upstream side and the magnitude of the rate of change of excitation current of the second projection lens on the downstream side is almost equal to a magnification decided by the two projection lenses on the upstream and downstream sides. In this embodiment, the rate of change of the first projection lens on the downstream side is 1/10 of the rate of change of the second projection lens on the upstream side.

Figure 3:
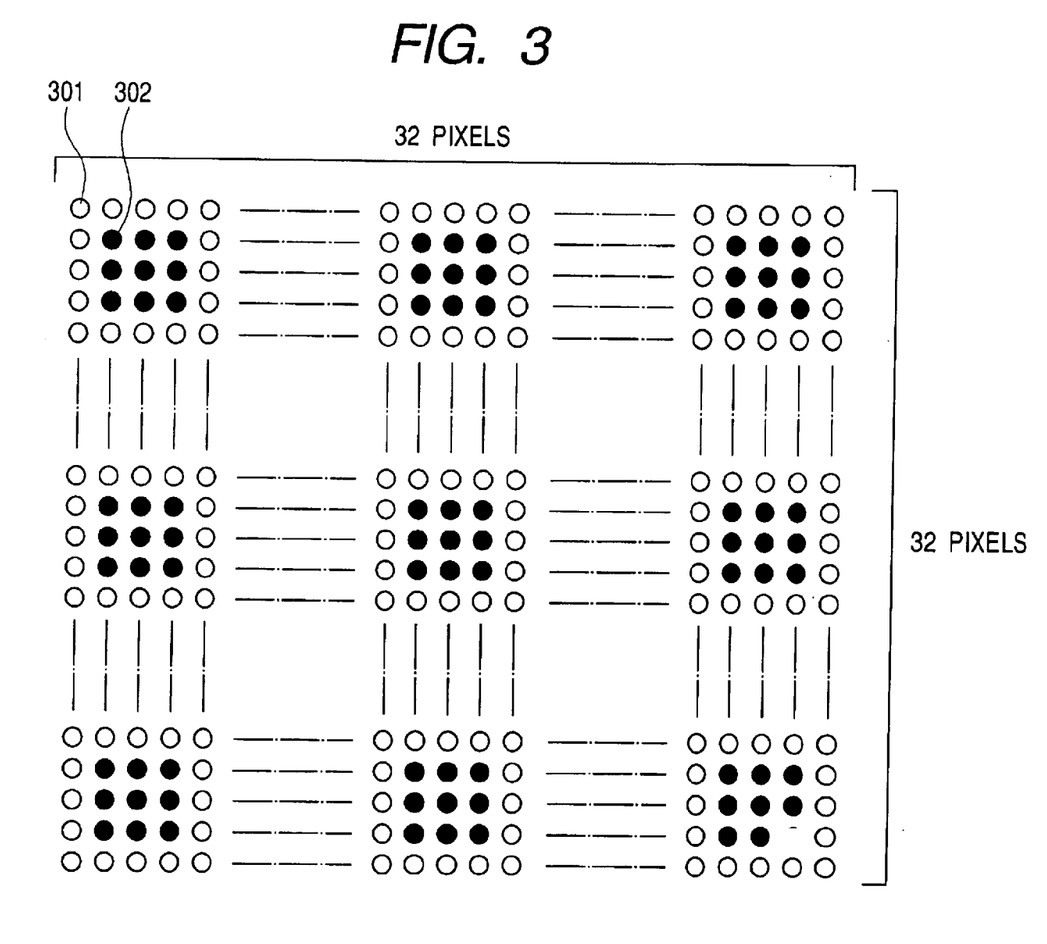
FIG. 3 is a diagram showing an example of selection of multi beams of Embodiment 1.

FIG. 3 shows an example of arrangement of multi beams used in this embodiment. For the number of the multi beams, 32×32=1024. In the drawing, the hollowed ○ mark indicates the position of a usable electron beam 301 and the black mark indicates the position of an electron beam 302 actually used in adjustment.

Specific multi beams of them are used for adjustment. Nine (black ● mark) electron beams positioned in the center of 32×32 multi beams are used. Nine (black ● mark) electron beams are respectively used in eight positions around them. The electron beams used are 81 (9×9) beams. Nine of them are respectively used to obtain a signal in each of the areas.

One electron beam remains at about 1 nA, which interferes with position measurement with high precision and position measurement in a short time. Nine electron beams are used at the same time to increase the amount of current, reducing these problems. In adjustment, there may be five positions (the center and four corners) to 25 positions (5×5) at most in an area projected once. Plural beams can be used in the respective positions.

Figure 4A:
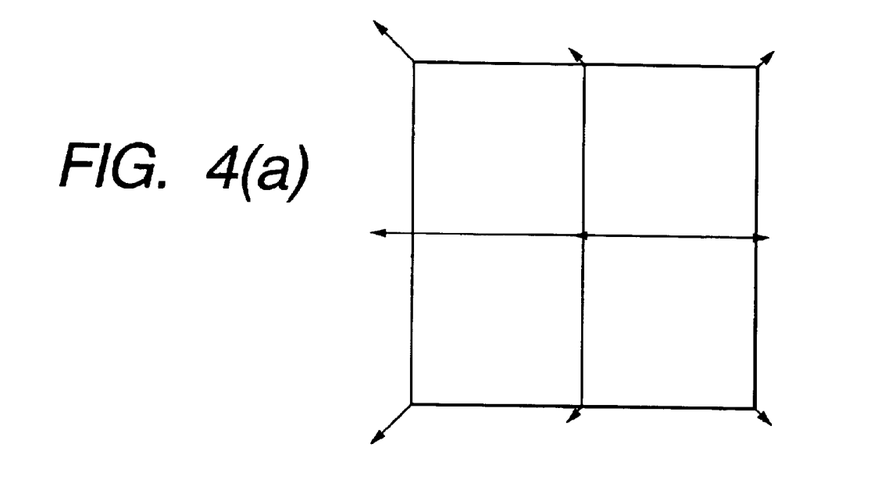
FIGS. 4(a) to 4(c) are diagrams showing an example of movement of beams of Embodiment 1.

FIG. 4(*a*) shows the change of position of actual electron beams. The length and direction of the arrow shown in the drawing indicate the change of position. The rate of change of excitation current is 0.2%, which is 2 mA in terms of an electric current. The preferable rate of change of excitation current is decided by the magnitude of the amount of change of position and the magnitude of deterioration of measurement precision, which is suitable in the range of 0.1 to 1%. The change of position occurs in the direction spreading over the entirety before adjustment. The change on the left side is larger. Spreading over the entirety shows that the lens condition is unsuitable and asymmetry shows diagonal incidence.

Figure 4B:
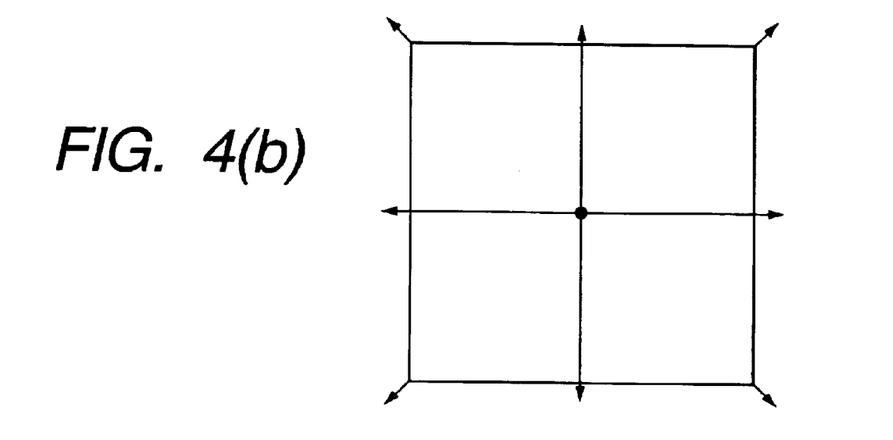
Figure 4C:
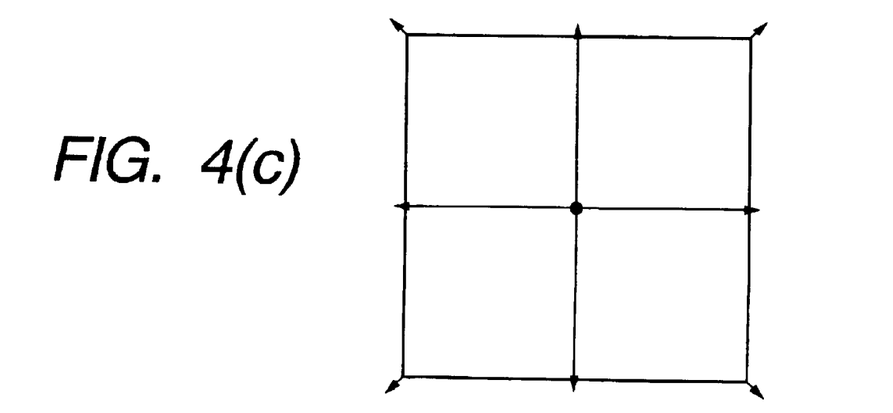

As shown in FIG. 4(*b*), while the aligner condition is changed to vary an incident angle, the amount of change of position is allowed to be symmetric. As shown in FIG. 4(*c*), two lens conditions are changed while being engaged with each other, the electron beams are adjusted in an optimal direction.

The doublet lens condition and the aligner condition are adjusted with high precision. The states of the amounts of change of position of these are changed substantially linearly to the change of the doublet lens and the aligners. It is easy to automatically change the lenses and aligner value to obtain an optimal value from the measured result for automatic setting.

Figure 6:
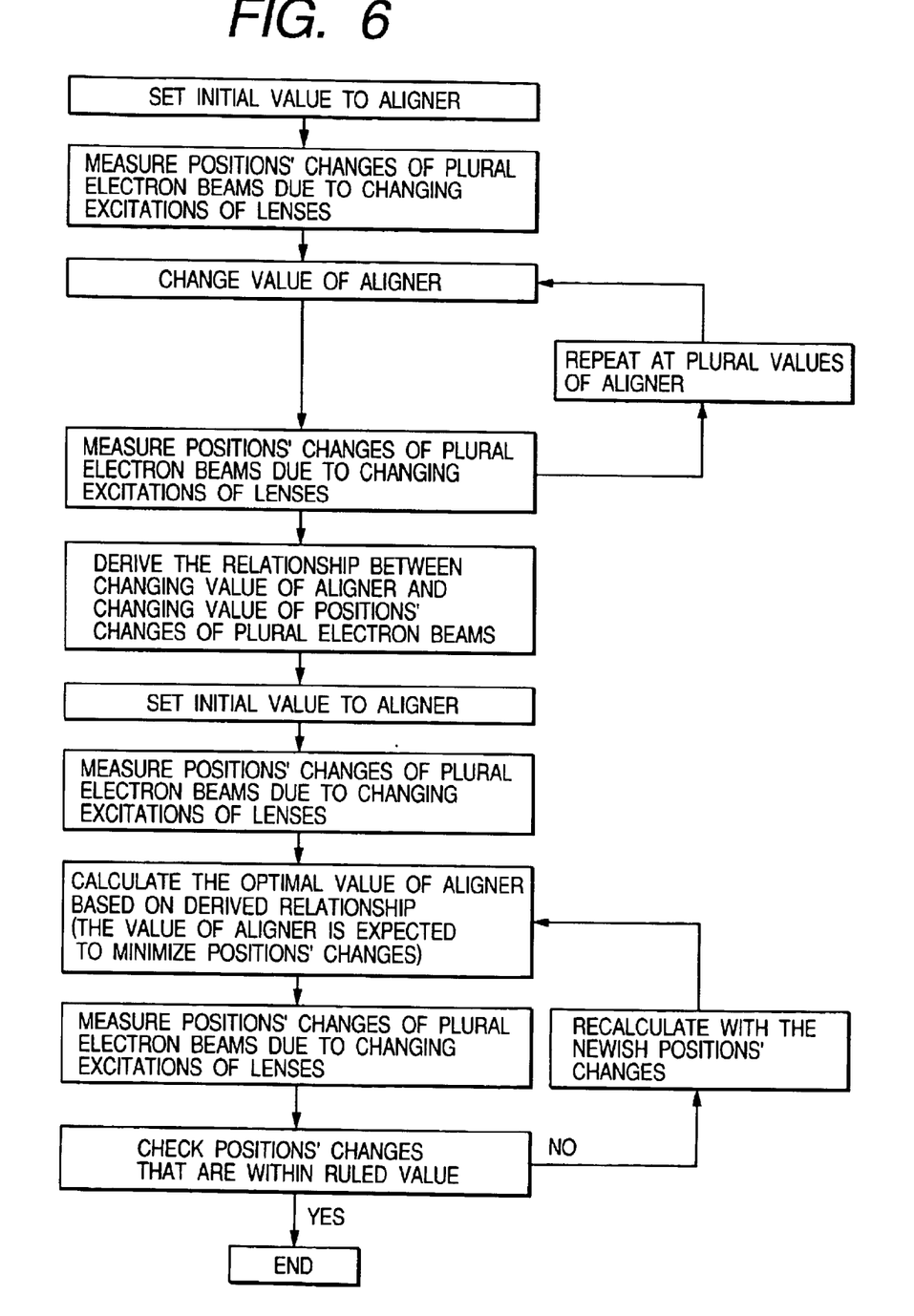
FIG. 6 is a diagram of assistance in explaining an example of a flow (algorithm) for automatically setting an aligner value according to the present invention.

FIG. 6 shows an example of a flow (algorithm) for automatically setting an aligner value (an electric current value of the aligner).

Excitation of the doublet lens is changed with a predetermined initial value or the current value to obtain the change of position of plural electron beams. Plural aligner values are changed to obtain the change of position of the plural electron beams at the respective values. As a result, the correlation between the change of the aligner values and the change values of the change of position can be quantitatively obtained. The relational expression can be approximated by primary linear conversion. The relational expression need not be obtained every time. Generally, only the following algorithm can be applied. In other words, excitation of the doublet lens is changed with a predetermined initial value or the current value to obtain the change of position of plural electron beams. The amount of change of the aligner minimizing the change of position is obtained by the obtained change of position and the above relational expression. The change of position at the aligner value set according to this is obtained. When the change of position is below the predetermined value, the adjustment is terminated. When it is above the predetermined value, the amount of change of the aligner minimizing the change of position is obtained again to repeat the adjustment. The above algorithm can be applied to lens adjustment by changing the aligner value to an excitation current value of the doublet lens.

The above operation can be executed while performing monitoring on the display.

After the above adjustment, writing is performed. Before the adjustment, only a pattern of 200 nm can be formed on the entire surface (128 μm square area). After the adjustment, a pattern of 65 nm can be formed on the entire surface. The projection deformation can be reduced from 300 nm to below 10 nm.

(Embodiment 2)

Figure 5:
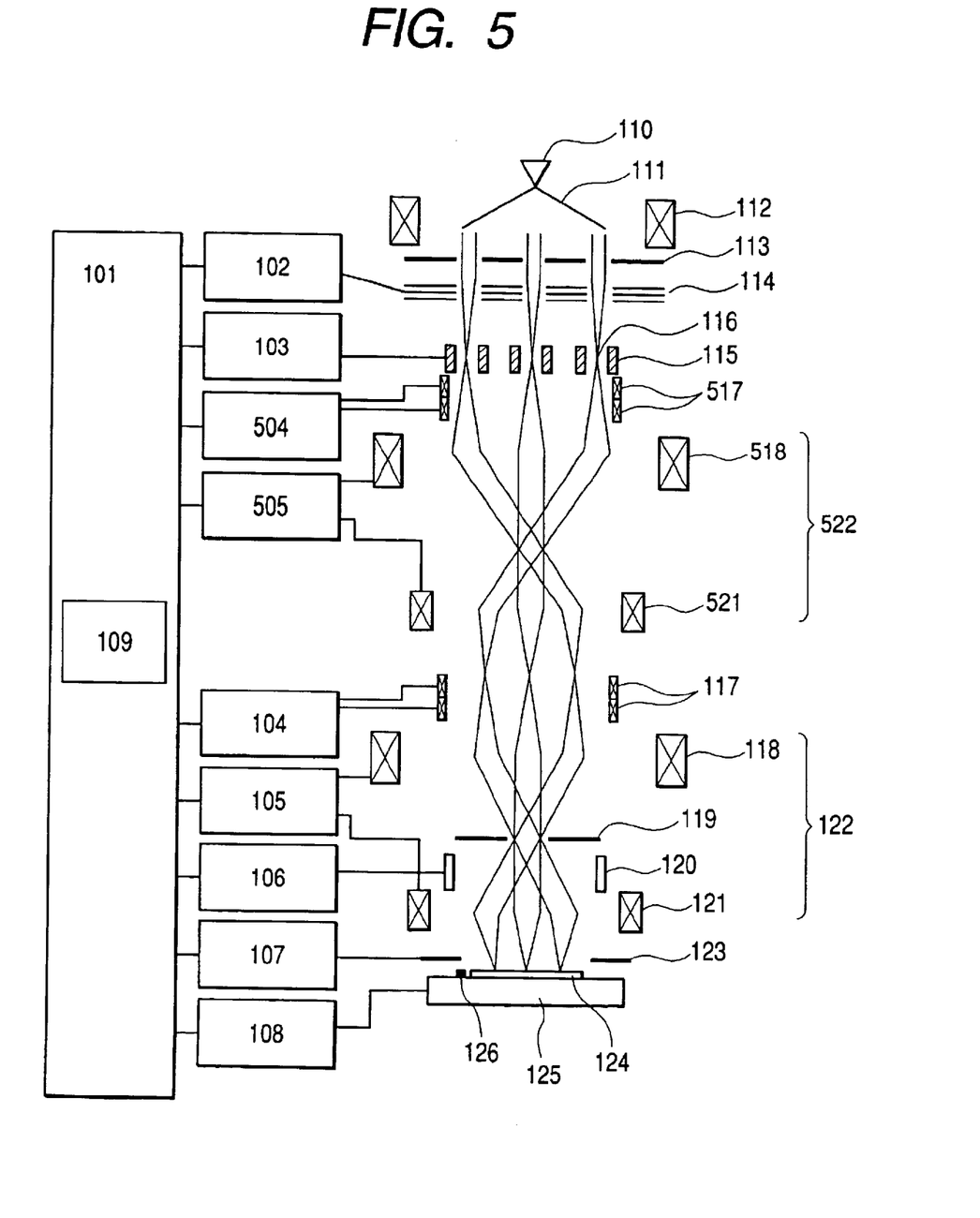
FIG. 5 is a diagram showing a system configuration example of Embodiment 2 of the present invention.

FIG. 5 shows a system configuration of this embodiment. The basic configuration is the same as that of Embodiment 1. In this embodiment, to reduce the magnification, one more stage of the doublet lens is inserted, constructing two stages. A second doublet lens 522 having a third projection lens 518 and a fourth projection lens 521 and the (first) doublet lens 122 are provided in two stages. The magnifications are 0.1 and 0.2, respectively.

In the drawing, the numeral 504 denotes a second aligner control circuit; the numeral 505, a second lens control circuit; and the numeral 517, a second aligner.

In this case, the doublet lens 122 at the later stage in which an aperture angle is increased in an image plane is important. This adjusting method is applied to the doublet lens 122 at the later stage. For the focus lengths of the doublet lens 122 at the later stage, f1=125 mm and f2=25 mm. The rate of change of excitation is 0.5%. Also in this embodiment, excitation adjustment of the doublet lens and aligner intensity adjustment can reduce the change of position.

After the above adjustment, writing is performed. Before the adjustment, only a pattern of 150 nm can be formed on the entire surface (64 μm square area). After the adjustment, a pattern of 65 nm can be formed on the entire surface. The projection deformation can be reduced from 100 nm to below 10 nm.

The present invention can realize an electron beam exposure technique which can perform high-precision electron beam adjustment of electron beam exposure equipment performing large field projection by a doublet lens and can form a high-resolution device pattern.

What is claimed is:

1. Electron beam exposure equipment comprising:
   an electron gun;
   an electron optics system irradiating an electron beam emitted from said electron gun on a sample via aligners and two electromagnetic lenses for forming one image;
   an electron detector used for detecting the position of said electron beam,
   an aligner control circuit that drives the aligners,
   a lens control circuit that drives the two electromagnetic lenses,
   a data control circuit that controls said aligner control circuit and said lens control circuit, and
   a means for measuring a position of the electron beam,
   said means for measuring a position of the electron beam measures the position of the electron beam, and
   said data control circuit gives data for optical adjustment of said electron optics system to said aligner control circuit and said lens control circuit, based on the measured result of the position of the electron beam.

2. The electron beam exposure equipment according to claim 1, wherein said electron beams are multi beams having plural electron beams arrayed at a predetermined pitch, and a specific electron beam of said multi beams is used to measure the position of an electron beam near an image plane.

3. The electron beam exposure equipment according to claim 1, wherein one of said two electromagnetic lenses is under stronger excitation, and the other is under weaker excitation.

4. The electron beam exposure equipment according to claim 1, wherein in said resetting, one of said two electromagnetic lenses is under stronger excitation, and the other is under weaker excitation.

5. The electron beam exposure equipment according to claim 1, wherein the magnitudes of the rates of change of excitation current of said two electromagnetic lenses are almost equal.

6. The electron beam exposure equipment according to claim 1, wherein the magnitudes of the change of excitation current of said two electromagnetic lenses are almost equal.

7. The electron beam exposure equipment according to claim 1, wherein in said resetting, the ratio between the magnitude of the rate of change of excitation current of the electromagnetic lens on the upstream side of said two electromagnetic lenses and the magnitude of the rate of change of excitation current of the electromagnetic lens on the downstream side thereof is almost equal to a magnification decided by said two electromagnetic lenses.

8. Electron beam exposure equipment comprising:
   an electron optics system irradiating plural electron beams arrayed at a predetermined pitch on a sample via aligners and a doublet lens having two electromagnetic lenses for forming one image;
   an electron detector used for detecting the position of said electron beam,
   means for measuring a position of a specific electron beam of said plural electron beams near an image plane with changing excitation of the two electromagnetic lenses, and
   means for resetting a driving current to the aligners and/or the excitation intensity of the two electromagnetic lenses based on the measured result of the position of the electron beam.

9. The electron beam exposure equipment according to claim 8, wherein one of said two electromagnetic lenses is under stronger excitation, and the other is under weaker excitation.

10. The electron beam exposure equipment according to claim 8, wherein in said resetting, one of said two electromagnetic lenses is under stronger excitation, and the other is under weaker excitation.

11. The electron beam exposure equipment according to claim 8, wherein the magnitudes of the rates of change of excitation current of said two electromagnetic lenses are almost equal.

12. The electron beam exposure equipment according to claim 8, wherein the magnitudes of the change of excitation current of said two electromagnetic lenses are almost equal.

13. The electron beam exposure equipment according to claim 8, wherein in said resetting, the ratio between the magnitude of the rate of change of excitation current of the electromagnetic lens on the upstream side of said two electromagnetic lenses and the magnitude of the rate of change of excitation current of the electromagnetic lens on the downstream side thereof is almost equal to a magnification decided by said two electromagnetic lenses.

14. Electron beam exposure equipment comprising:
   an electron gun;
   an electron optics system irradiating an electron beam emitted from said electron gun on a sample via aligners and at least two electromagnetic lenses for forming one image;
   an electron detector used for detecting the position of said electron beam,
   means for measuring the position of the electron beam near an image plane with changing excitation of the two electromagnetic lenses, and
   means for resetting a driving current to the aligners and/or the excitation intensity of the two electromagnetic lenses based on the measured result of the position of the electron beam.

15. An electron beam exposure method comprising the steps of:
   irradiating an electron beam emitted from an electron gun on a sample via aligners and an electron optics system having two electromagnetic lenses for forming one image;
   detecting the position of said electron beam using said electron detector; and measuring the position of an electron beam near an image plane with changing excitation of said two electromagnetic lenses, calculating data to drive the aligners and the two electromagnetic lenses based on the measured result of the position of the electron beam, and resetting the drive of the aligners and/or the excitation intensity of the two electromagnetic lenses based on said calculated data.

16. The electron beam exposure method according to claim 15, wherein said electron beam comprises multi beams having plural electron beams arrayed at a predetermined pitch, and a specific electron beam of said multi beams is used to measure the position of an electron beam near an image plane.

17. The electron beam exposure method according to claim 16, wherein a specific electron beam of said multi beams is used to measure the position of an electron beam near an image plane, and a value obtained from the position of said specific electron beam is used as the position of an electron beam.

18. The electron beam exposure method according to claim 15, wherein in said resetting, one of said two electromagnetic lenses is under stronger excitation, and the other is under weaker excitation.

19. The electron beam exposure method according to claim 15, wherein the magnitudes of the rates of change of excitation current of said two electromagnetic lenses or the magnitudes of the change thereof are almost equal.

20. The electron beam exposure method according to claim 15, wherein in said resetting, the ratio between the magnitude of the rate of change of excitation current of the electromagnetic lens on the upstream side of said two electromagnetic lenses and the magnitude of the rate of change of excitation current of the electromagnetic lens on the downstream side thereof is almost equal to a magnification decided by said two electromagnetic lenses.

* * * * *